US009357322B2

United States Patent
Gautama

(10) Patent No.: US 9,357,322 B2
(45) Date of Patent: May 31, 2016

(54) LOUDSPEAKER POLARITY DETECTOR

(71) Applicant: NXP B.V., Eindhoven (NL)

(72) Inventor: Temujin Gautama, Leuven (BE)

(73) Assignee: NXP B.V., Eindhoven (NL)

( * ) Notice: Subject to any disclaimer, the term of this patent is extended or adjusted under 35 U.S.C. 154(b) by 32 days.

(21) Appl. No.: 14/508,569

(22) Filed: Oct. 7, 2014

(65) Prior Publication Data

US 2015/0131806 A1 May 14, 2015

(30) Foreign Application Priority Data

Nov. 14, 2013 (EP) .................................. 13192918

(51) Int. Cl.
| | |
|---|---|
| *H04R 29/00* | (2006.01) |
| *G01R 19/00* | (2006.01) |
| *G01R 27/02* | (2006.01) |
| *H04R 5/04* | (2006.01) |
| *G01R 19/14* | (2006.01) |

(52) U.S. Cl.
CPC ............... *H04R 29/001* (2013.01); *H04R 5/04* (2013.01); *G01R 19/14* (2013.01)

(58) Field of Classification Search
None
See application file for complete search history.

(56) References Cited

U.S. PATENT DOCUMENTS

| | | | | |
|---|---|---|---|---|
| 3,067,297 | A * | 12/1962 | Fink ....................... | H04R 29/00 381/1 |
| 4,908,868 | A * | 3/1990 | McTaggart ............... | H04R 5/04 327/3 |
| 5,319,714 | A | 6/1994 | McTaggart | |
| 6,681,019 | B1 | 1/2004 | Kitano et al. | |
| 7,734,054 | B2 * | 6/2010 | Asada ................... | H04R 29/001 381/58 |
| 2006/0050891 | A1 | 3/2006 | Bharitkar | |
| 2006/0062399 | A1 * | 3/2006 | McKee Cooper ....... | G01S 11/14 381/58 |
| 2010/0239099 | A1 | 9/2010 | Yonemoto et al. | |
| 2011/0299691 | A1 * | 12/2011 | Yoshino ................. | H04R 29/00 381/59 |
| 2014/0198920 | A1 * | 7/2014 | Lee ......................... | G08B 29/06 381/59 |

FOREIGN PATENT DOCUMENTS

EP 2 453 669 A1 5/2012

OTHER PUBLICATIONS

Klippel, W. Loudspeaker Nonlinearities—Causes, Parameters, Symptoms, J. Audio Eng. Society, 36 pgs. (Oct. 2005).
Klippel, W. Distortion Analyzer—A New Tool for Assessing and Improving Electrodynamic Transducer, J. Audio Eng. Society, 36 pgs. (Feb. 2000).
Extended European Search Report for EP Patent Appln. No. 13192918.4 (Mar. 19, 2014).

* cited by examiner

*Primary Examiner* — Brenda Bernardi

(57) ABSTRACT

A method comprising the steps of:
determining one or more impedance values of a loudspeaker; and
determining the polarity of a loudspeaker based on the one or more impedance values.

13 Claims, 4 Drawing Sheets

LOUDSPEAKER POLARITY DETECTOR

CROSS-REFERENCE TO RELATED APPLICATIONS

This application claims the priority under 35 U.S.C. §119 of European patent application no. 13192918.4, filed on Nov. 14, 2013, the contents of which are incorporated by reference herein.

This invention relates to loudspeakers, and particularly, but not exclusively to detecting the polarity of a loudspeaker.

Loudspeakers generally comprise a diaphragm (or cone), connected to a rigid frame, via a flexible suspension that constrains a voice coil to move axially through a cylindrical magnetic gap. When an electrical signal is applied to the voice coil, a magnetic field is created by the electric current in the voice coil, making it a variable electromagnet. The coil and the driver's magnetic system interact, generating a mechanical force that causes the coil (and thus, the attached diaphragm) to move back and forth, thereby reproducing sound under the control of the applied electrical signal coming from the amplifier.

The polarity of a loudspeaker determines whether the loudspeaker diaphragm (e.g. cone) moves out or in relative to the voltage polarity of the signal.

In audio systems with multiple loudspeakers, it may be important to connect the loudspeakers in phase with each other (i.e., with the same polarity). If they are connected incorrectly, the audio signal will not be reproduced faithfully. For example, if two loudspeakers with different polarity receive the same signal, at any given instant one loudspeaker diaphragm (e.g. cone) will be moving out and the other moving in. This may cause phase cancellations at certain frequencies and may be very noticeable. That is, the stereo image may be distorted or the low frequencies may be attenuated (because the low frequencies of one loudspeaker may cancel those of another). Therefore, ensuring that loudspeakers are connected with the correct polarity may mitigate the effects of the loudspeaker diaphragm of different loudspeakers moving in counterphase (or anti-phase).

Because the polarity of the loudspeakers may affect the audio output signal, it may be possible to measure the polarity using, for example, a microphone. However, this may require additional equipment and may be affected by other acoustic effects (e.g. by the shape of the room).

According to a first aspect of the invention, there is provided a method comprising the steps of:
  determining one or more impedance values of a loudspeaker; and
  determining the polarity of a loudspeaker based on the one or more impedance values.

The method may comprise the step of determining a plurality of impedance values of a loudspeaker, each of the impedance values corresponding to a different input signal or input signal portions provided to the loudspeaker. The signal portions may comprise different temporal segments of a signal.

The step of determining the polarity of the loudspeaker may comprise calculating the difference between a first impedance corresponding to a first input signal and a second impedance corresponding to a second input signal, wherein
  the first input signal comprises a signal with a predetermined frequency, and
  the second input signal comprises a signal with the predetermined frequency and an additional direct current signal.

The method may comprise the step of determining a plurality of impedance values for different portions of an input signal, the input signal comprising:
  a pilot signal with a predetermined frequency; and
  an audio signal.

The step of determining the polarity of the loudspeaker may comprise comparing the determined one or more impedance values with corresponding reference values.

The corresponding reference values may comprise at least one of:
  expected impedance values;
  impedance values determined for another loudspeaker;
  corresponding input audio signal values; and
  a processed version of corresponding input audio signal values.

The comparison may comprise temporal cross-correlation of the determined one or more impedance values and the corresponding reference values.

The step of determining the one or more impedance values may comprise determining a plurality of impedance values for a number of different input signals, each input signal being distinguished by at least one of: having a different frequency; and comprising a different DC-value.

The step of determining the polarity of the loudspeaker may comprise comparing the plurality of impedance values with corresponding impedance values measured for a different loudspeaker.

The step of determining each impedance value may comprise measuring:
  the voltage across the loudspeaker voice coil; and
  the current flowing through the loudspeaker voice coil.

In particular, the electrical impedance of a loudspeaker may be measured using the ratio of the voltage across and the current flowing into the loudspeaker voice coil:

$$Z(\omega) = \frac{V(\omega)}{I(\omega)},$$

where $V(\omega)$, $I(\omega)$ and $Z(\omega)$ are the voltage, current and electrical impedance function at frequency $\omega$.

The method may comprise the step of determining the relative polarity of the loudspeaker with respect to other loudspeakers in a loudspeaker system.

According to a further aspect, there is provided an apparatus comprising:
  impedance determining module configured to determine one or more impedance values of a loudspeaker; and
  polarity determining module configured to determine the polarity of a loudspeaker based on the one or more impedance values.

It will be appreciated that the apparatus may determine the impedance and/or polarity using one of the described methods.

The polarity determining module may comprise a processor.

The impedance determining module may comprise:
  a current sensing means to measure the current passing through the loudspeaker;
  a voltage sensing means to measure the voltage across the loudspeaker; and
  a processor configured to determine the ratio of the voltage to the current.

The impedance determining module may consist of a voltage sensing means (such as a voltage sense amplifier), a current sensing means (such as a current sense amplifier the output voltage of which may be proportional to the current; a current sense or shunt resistance in series with the load may be used to convert the load current to a small voltage, which is amplified by the current sense amplifier) and a means for computing the impedance according to $$Z(\omega) = \frac{V(\omega)}{I(\omega)}$$

(such as a processor and analog-to-digital converters for converting the voltage and current signals to the digital domain).

The apparatus may, or may not, comprise a signal generator configured to generate a predetermined signal, and wherein the apparatus is configured to determine a plurality of impedance values of a loudspeaker, each of the impedance values corresponding to a different input signal or input signal portion provided to the loudspeaker.

The apparatus may or may not comprise the loudspeaker.

According to a further aspect, there is provided a computer program comprising computer program code configured to:
  determine one or more impedance values of a loudspeaker; and
  determine the polarity of a loudspeaker based on the one or more impedance values.

Embodiments will now be described by way of non-limiting examples with reference to the accompanying figures, in which.

Figure 1:
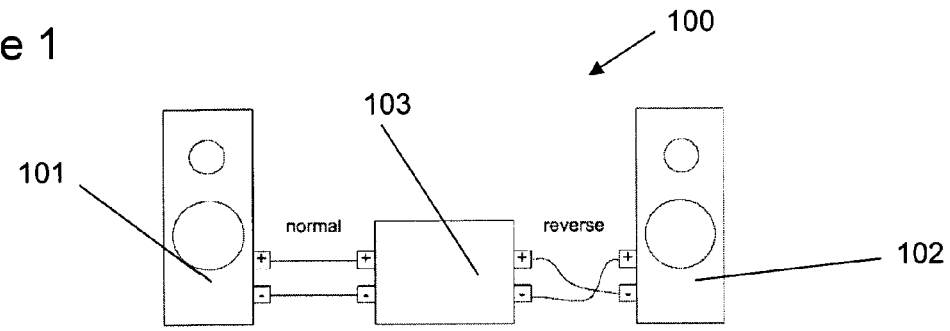
FIG. 1 illustrates a loudspeaker system.

A loudspeaker system 100 is illustrated in FIG. 1 which comprises two loudspeakers 101, 102. In particular, the loudspeaker system comprises a dual-channel amplifier 103 with two loudspeakers 101, 102 connected to it: one loudspeaker 101 with normal polarity; the other loudspeaker 102 with reverse polarity.

Generally, for a loudspeaker that is connected with normal polarity, a positive voltage results in an outward movement of the loudspeaker diaphragm, and a negative voltage results in an inward movement of the diaphragm.

It has been realised that the electrical impedance of a loudspeaker changes as a function of the diaphragm displacement. This is because the impedance of the loudspeaker is affected by changes in other loudspeaker parameters (such as the Bl-factor, the inductance and the stiffness) which in turn are affected by the diaphragm displacement. Therefore, movement of the diaphragm effects the electrical impedance of the loudspeaker.

This invention relates to a method and system to determine the polarity of a single or multiple loudspeakers by analysing the electrical impedance variations of the loudspeaker(s) and/or variations in the diaphragm displacement (or related signals).

Figure 2A:
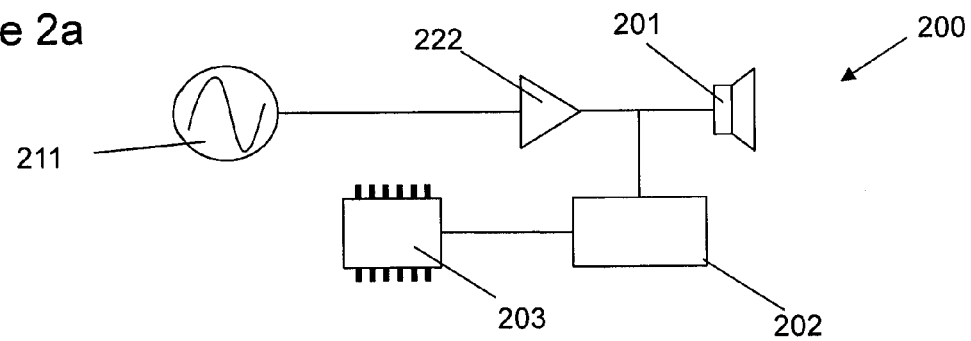
FIGS. 2a-2b illustrate an apparatus according to an embodiment of the invention configured to determine the absolute polarity of a loudspeaker.

FIG. 2a depicts a first embodiment 200 of the invention, comprising an apparatus configured to determine the polarity of a loudspeaker. In this case, the apparatus comprises: a signal generator 211; an amplifier 222; a loudspeaker 201; an impedance determining module 202; and a polarity determining module, which in this case is a processor 203.

The impedance determining module may consist of a voltage sensing means (such as a voltage sense amplifier), a current sensing means (such as a current sense amplifier) and a means for computing the impedance according to $$Z(\omega) = \frac{V(\omega)}{I(\omega)}$$

(such as a processor and analog-to-digital converters for converting the voltage and current signals to the digital domain).

Figure 2B:
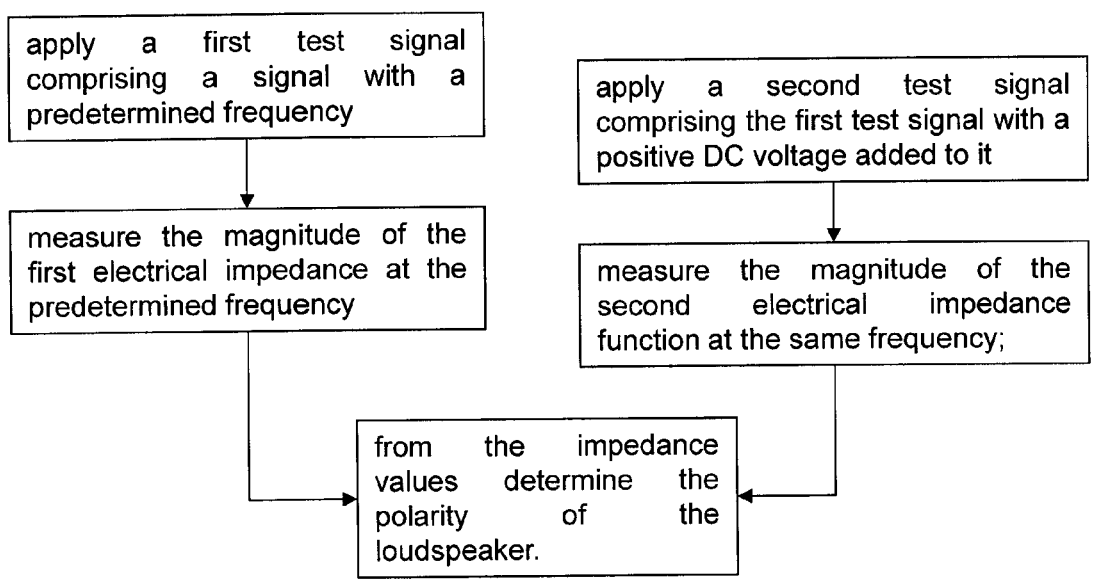

Using this apparatus, a calibration method (shown in FIG. 2b) is used to determine the absolute polarity of the loudspeaker 201 by determining whether the loudspeaker impedance is increased or decreased as a function of a positive DC voltage. The inductance of a loudspeaker that is connected with normal polarity is expected to decrease for an outward movement of the loudspeaker, and so, because the impedance of the loudspeaker is related to its inductance, the absolute polarity of a loudspeaker can be determined using measurements of the impedance. The impedance of a loudspeaker consists of, among others, a resistance, a motor impedance (resonance peak) and an inductance. The relative components making up the impedance vary with frequency. For example, the impedance is predominantly determined by the inductance at higher frequencies.

In this case, the effect of the loudspeaker impedance variation is measured at frequencies where the motor impedance is small, e.g., two octaves higher than the resonance frequency of the loudspeaker. In that frequency region, the effect of the variation of many other loudspeaker parameters (e.g., those constituting the motor impedance) is expected to be very small, and the loudspeaker impedance is predominantly determined by its inductance (which varies with diaphragm displacement). It will be appreciated that other embodiments may use other frequencies.

The calibration method comprises providing a first test signal to the loudspeaker 201 comprising a signal with a predetermined frequency. The first test signal may, for example, comprise a small amplitude sine wave at the predetermined frequency, $\omega_0$ (say, two octaves above the resonance frequency of the loudspeaker). Other non-sinusoidal waveforms may also be used provided that there is a non-zero signal component at the predetermined frequency. In this case, the signal is provided using the signal generator 211 and amplified using the amplifier 222. When the first test signal is being provided to the loudspeaker 201 the magnitude of the first electrical impedance is determined (e.g. by being measured or by estimation) at the predetermined frequency corresponding to the first test signal using the impedance determining module. In this case, the impedance determining module is configured to determine the first electrical impedance $Z_1(\omega_0)$ by measuring the amplitudes of voltage $V_1(\omega_0)$ and current $I_1(\omega_0)$ at that frequency $\omega_0$ (using voltage sensing and current sensing amplifiers, converting the signals to the digital domain and using, e.g., a DFT to compute the amplitudes at the given frequency) and computing the ratio, $$\frac{V_1(\omega_o)}{I_1(\omega_o)} = Z_1(\omega_o).$$

The method further comprises applying a second test signal, which consists of the first test signal (i.e. also comprising a signal with a predetermined frequency $\omega_0$) with a positive DC voltage signal added to it. When the second test signal is being provided to the loudspeaker 201 by the signal generator 211 and amplifier 222, the magnitude of a second electrical impedance corresponding to the second test signal is determined (e.g. by being measured or by estimation) at the predetermined frequency by the impedance determining module 202. As described before, the second electrical impedance $Z_2(\omega_0)$ is determined by estimating the amplitudes of voltage $V_2(\omega_0)$ and current $I_2(\omega_0)$ at the predetermined frequency $\omega_0$ (using voltage sensing and current sensing amplifiers) and computing the ratio $$\frac{V_2(\omega_o)}{I_2(\omega_o)} = Z_2(\omega_o).$$

That is, in this case, the determined impedance values correspond to a different input signal (the difference in this case being the DC voltage signal added to the second test signal).

It will be appreciated that the provision and measurement corresponding to the second test signal may be carried out before or after the provision and measurement corresponding to the first test signal.

The first and second impedance values are received from the impedance determining module by the polarity determining module (which in this case is a processor 203). The processor is configured to determine which of the first and second impedance values is the larger. The polarity sensing means is configured to determine that the loudspeaker has normal polarity if the amplitude of the second electrical impedance is smaller than that of the first. Conversely, the polarity sensing means is configured to determine that the loudspeaker has reverse polarity if the amplitude of the second electrical impedance is larger than the first electrical impedance. In this case, the processor 203 (e.g. a comparator) is used to determine which of the impedence values is larger.

Other example embodiments are configured such that if the electrical impedances are identical (or within a predetermined threshold) the apparatus is configured to repeat the calibration method with a larger DC voltage in the second test signal.

It will be appreciated that the method may be performed with a negative DC voltage. This method can be used for full-range loudspeakers or multi-way loudspeakers.

Figure 3A:
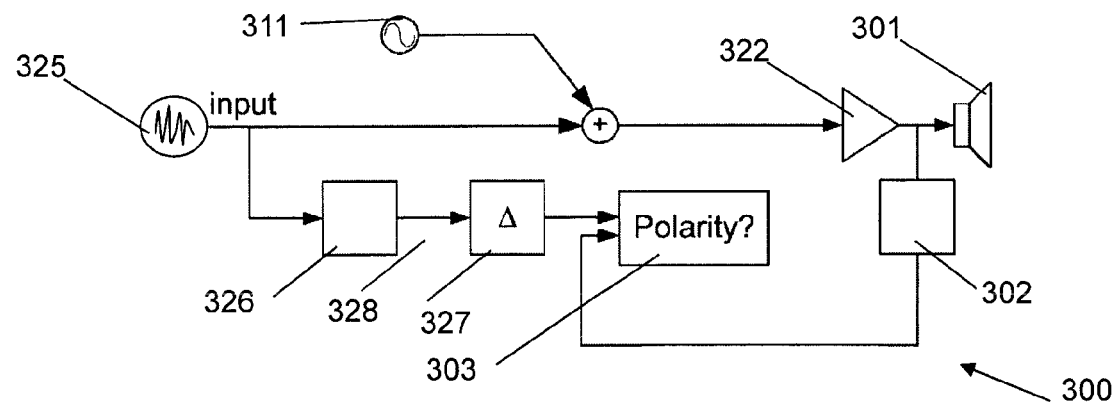
FIGS. 3a-3b illustrate a second embodiment of the invention configured to determine the absolute polarity of a loudspeaker.

FIG. 3*a* depicts a further embodiment 300 of the invention comprising an apparatus configured to determine the polarity of a loudspeaker. In this case, the apparatus comprises: a signal generator 311; an audio input 325; an amplifier 322; a loudspeaker 301 (full-range or multi-way); an impedance determining module 302; a polarity determining module 303, which in this case is a processor; a reference signal provider 326; and a time delay 327.

This embodiment is configured to determine the absolute polarity of a loudspeaker during normal operation of the amplifier and loudspeaker. This may remove the need for a dedicated calibration procedure.

In this case, the signal generator 311 is configured to generate a sinusoidal pilot tone (with a predetermined frequency such as that described in the first embodiment). This pilot tone is added to the audio input 325. The composite input signal (comprising the audio signal and the pilot signal) is amplified by an amplifier 322, and sent to the loudspeaker. When the composite input is being provided, the impedance determining module 302 is configured to measure the voltage and current components at the predetermined frequency, and calculate the ratio which gives the impedance, $$Z(f\text{pilot}) = \frac{V(f\text{pilot})}{I(f\text{pilot})}.$$

The magnitude of the electrical impedance at the pilot frequency, ($Z(f\text{pilot})$), is determined repeatedly at predetermined time intervals ($t_1$ to $t_N$), yielding a time signal that is related to the varying electrical impedance of the loudspeaker (the impedance in this case is changing because the position of the diaphragm is moving with the audio input, and the impedance at high frequencies is mostly related to changes in inductance, which varies with diaphragm displacement). That is, in this case, the determined impedance values correspond to different input signal portions (because the audio signal changes with time).

In this case, the $Z(f\text{pilot})$ signal (which corresponds to how the impedance changes with time) is compared to a reference signal 328, provided by the reference signal provider 326, which may be delayed by delay module 327 ("$\Delta$"). In this case, the reference signal 328 is the expected diaphragm displacement signal that is obtained from the audio signal (using loudspeaker voltage-to-excursion prediction block 326. This prediction block may consist of a filter that corresponds to the expected voltage-to-excursion transfer function and may receive the audio signal as input. The transfer function may be fixed, or may be made adaptive to account for possible changes in loudspeaker behaviour (due to temperature or ageing).

Figure 3B:
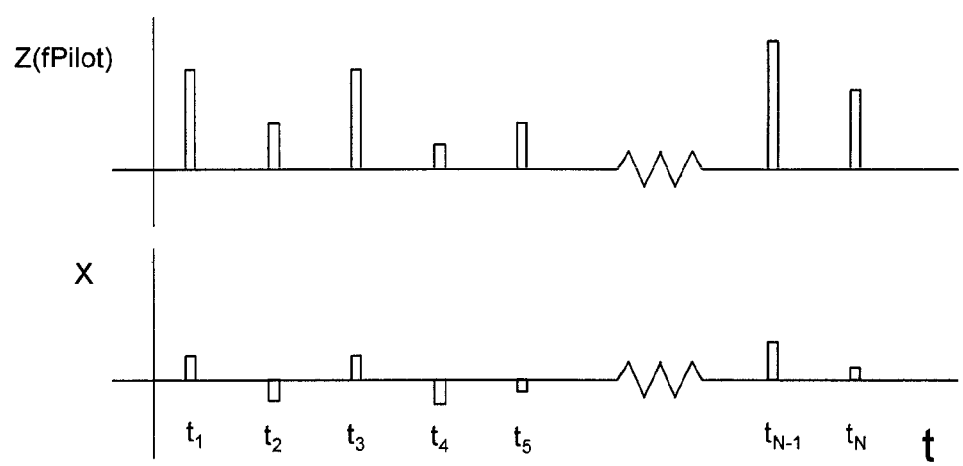

In this case, the apparatus comprises a polarity determining module 303 configured to determine whether the impedance signal, $Z(f\text{pilot})$, varies in phase or counterphase with the reference signal 328 (e.g. whether the impedance signal increases or decreases when the reference signal increases). If the impedance signal, $Z(f\text{pilot})$, varies in phase with the reference signal 328, then the processor is configured to determine that the loudspeaker has a reverse polarity. If the impedance signal varies out of phase with the reference signal 328, then the polarity determining module 303 is configured to determine that the loudspeaker has a normal polarity. A schematic plot of the determined impedance signal and reference signal is shown in FIG. 3*b* for a loudspeaker with reverse polarity.

It will be appreciated that, in other embodiments, the $Z(f\text{pilot})$ signal may be compared to the audio input signal (or a filtered version thereof) at the appropriate sampling rate (sampling rate conversion may be necessary to match the reference values to the predetermined time intervals of the determined impedance values). In such an embodiment, the audio signal would be appropriately delayed by the delay module 327 ("$\Delta$") to be time-aligned to the signal that is related to the varying electrical impedance. In this case, the absolute polarity can be determined, for example, by computing the peak in the cross-correlation function of the determined impedance values with the reference audio signal. A negative peak, in this case, would correspond to normal polarity.

It will be appreciated that, in another embodiment, the reference signal 328 may comprise impedance values (each reference impedance value corresponding to different input signal portions) determined for another loudspeaker that is being excited by the same composite input signal (audio signal 325 with pilot tone 311 added). If the impedance signal, $Z(f\text{pilot})$, varies in phase with the reference signal 328 then the processor is configured to determine that the two loudspeaker have the same polarity. If the impedance signal varies out of phase with the reference signal 328, then the polarity determining module 303 is configured to determine that the two loudspeakers have different polarities.

Figure 4A:
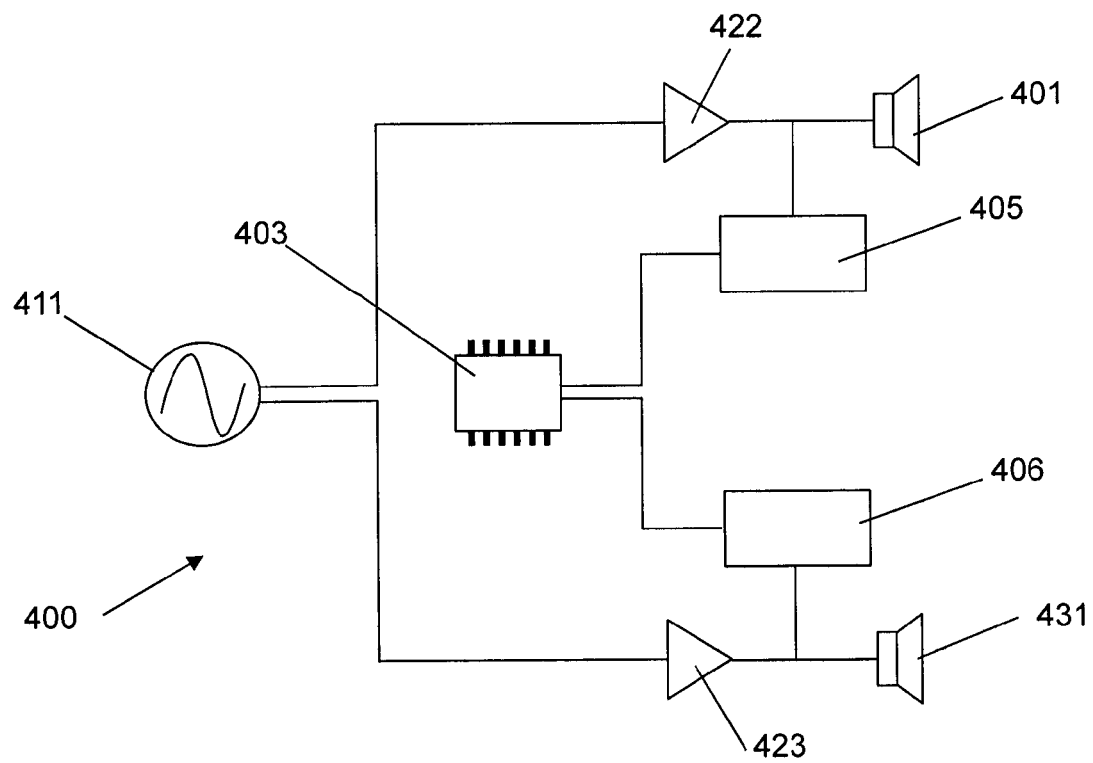
FIGS. 4a-4b illustrate a third embodiment of the invention configured to determine the relative polarity of a plurality of loudspeakers.

FIG. 4a depicts a further embodiment 400 of the invention comprising an apparatus configured to determine the relative polarity of a plurality of loudspeakers. In this case, the apparatus comprises a signal generator 411 configured to provide an input signal to a first loudspeaker 401 and a second loudspeaker 431 via respective first and second amplifiers 422, 423. The impedance of the first and second loudspeakers 401, 431 are each determined by respective first and second impedance determining modules 405, 406. In this case, the impedance determining modules each comprise a current sensing means to measure the current passing through the loudspeaker; a voltage sensing means to measure the voltage across the loudspeaker; and a processor configured to determine the ratio of the voltage to the current, thereby determining the impedance. The apparatus further comprises a polarity determining module 403 configured to determine the relative polarity of the loudspeakers 401, 431 based on the impedance values provided by the first and second impedance determining modules 405, 406.

Figure 4B:
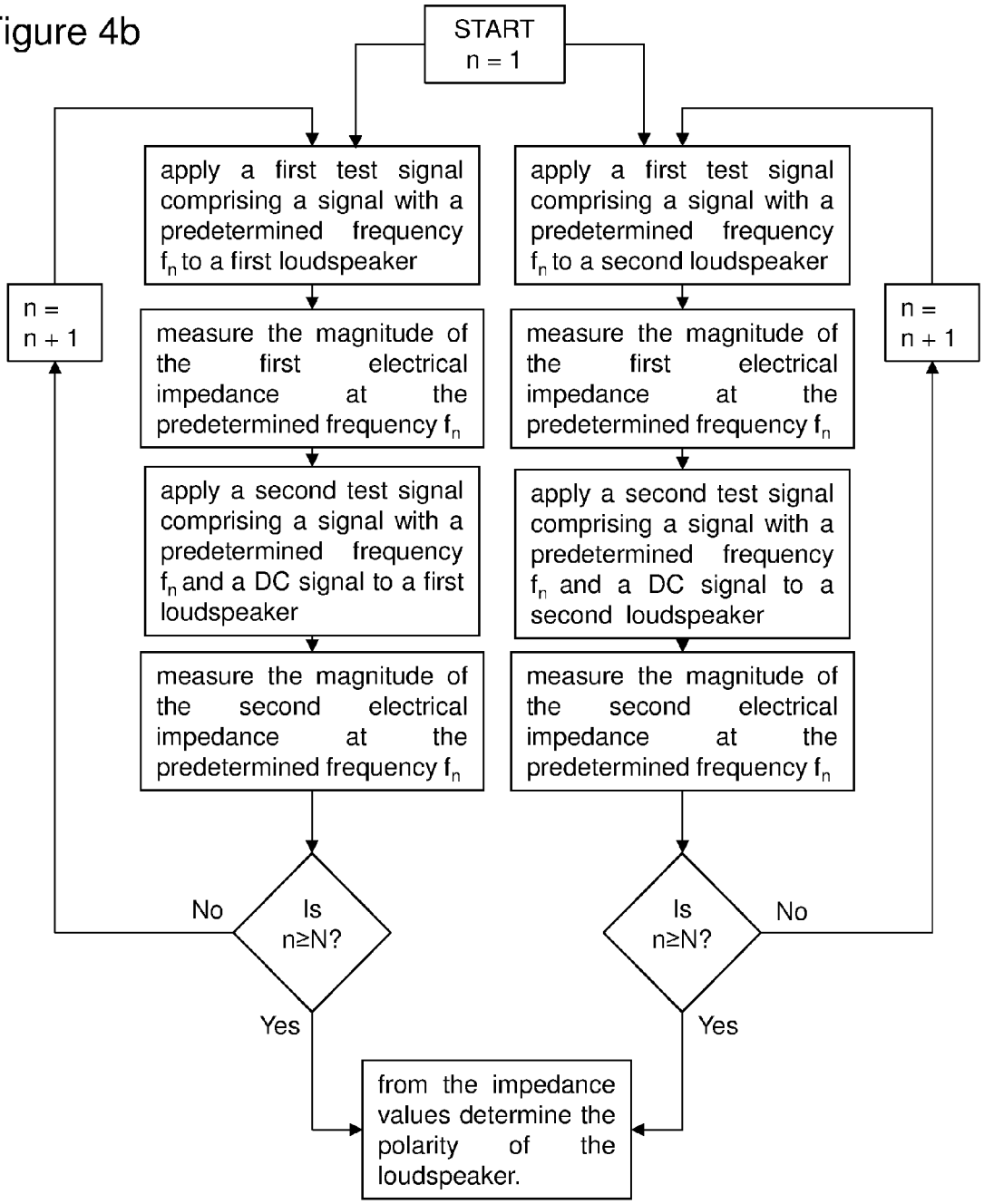

In this case the apparatus is configured such that the relative phase of two (or more) loudspeakers are determined in a calibration phase (as shown in FIG. 4b). The electrical impedance function of a loudspeaker changes across the entire frequency spectrum as a function of the diaphragm displacement. If the electrical impedance is measured for multiple frequencies, or over a portion of the frequency spectrum (e.g., from 5 Hz up to half the sampling rate) with and without the addition of a positive DC voltage (due to which there will be a fixed change of the loudspeaker diaphragm displacement, which in turn, changes the impedance of the loudspeaker), a variation of the electrical impedance function can be determined that is caused by a fixed change in loudspeaker diaphragm displacement. In this case, the apparatus is configured to provide a series of test signals comprising different predetermined frequencies, $f_1$-$f_N$, to each loudspeaker 401, 431. For each of these frequencies, the apparatus is configured to measure the magnitude of the impedance of the loudspeaker at that frequency in the absence and the presence of the DC voltage. In this case, as each of the impedances is measured, they are stored by the polarity determining module 403.

When all of the frequencies have been provided and the corresponding impedances measured in the absence and the presence of the DC voltage, the polarity determining module is configured to compare the variation in values that are caused by a fixed change in diaphragm displacement for both loudspeakers. Assuming the loudspeakers are similar, the variation due to the fixed diaphragm displacement should be similar to each other if all loudspeakers are connected with the same polarity. A large difference between loudspeaker impedance values would indicate a different polarity. Therefore, in this case, the polarity determining module is configured to determine whether the variation in impedance across the multiple frequencies that are caused by a fixed loudspeaker diaphragm displacement is similar. If they are similar, the polarity determining module will determine that the polarities are the same, and if not, the polarity determining module will determine that the polarities are different.

In certain embodiments, the relative phase of the loudspeakers is more important than the absolute phase. That is, when the diaphragms of a plurality of loudspeakers are moving in the same direction for a given signal, attenuation between loudspeakers is diminished.

It will be appreciated that embodiments may be used in audio amplifiers for home or automotive settings, where the polarity of the loudspeakers is important for a high-quality audio reproduction. The proposed invention can also be used in mobile phones, where either the polarity is required to know the absolute polarity of a single loudspeaker (which can be important in applications involving loudspeaker modelling), or the relative polarity of multiple loudspeakers needs to be determined for good audio reproduction.

Any components that are described herein as being "coupled" or "connected" could be directly or indirectly coupled or connected. That is, one or more components could be located between two components that are said to be coupled or connected whilst still enabling the required functionality to be achieved.

The invention claimed is:

1. A method comprising the steps of:
   determining a plurality of impedance values of a loudspeaker, each of the impedance values corresponding to a different input signal or input signal portions provided to the loudspeaker; and
   determining the polarity of the loudspeaker based on the impedance values.

2. The method of claim 1, wherein the step of determining the polarity of the loudspeaker comprises calculating the difference between a first impedance corresponding to a first input signal and a second impedance corresponding to a second input signal, wherein
   the first input signal comprises a signal with a predetermined frequency, and
   the second input signal comprises a signal with the predetermined frequency and an additional direct current signal.

3. The method of claim 1, wherein the method comprises the step of determining a plurality of impedance values for different portions of an input signal, the input signal comprising:
   a pilot signal with a predetermined frequency; and
   an audio signal.

4. The method of claim 3, wherein the step of determining the polarity of the loudspeaker comprises comparing the determined impedance values for the different portions of the input signal with corresponding reference values.

5. The method of claim 4, wherein the corresponding reference values comprise at least one of:
   predetermined expected impedance values;
   impedance values determined for another loudspeaker;
   corresponding input audio signal values; and
   a processed version of corresponding input audio signal values.

6. The method of claim 4, wherein the comparison comprises temporal cross-correlation of the determined impedance values and the corresponding reference values.

7. The method of claim 1, wherein the step of determining the impedance values of the loudspeaker comprises determining a plurality of impedance values for a number of different input signals, each input signal being distinguished by at least one of: having a different frequency; and comprising a different DC-value.

8. The method of claim 7, wherein the step of determining the polarity of the loudspeaker comprises comparing the plurality of impedance values with corresponding impedance values measured for a different loudspeaker.

9. The method of claim 1, wherein the step of determining each impedance value comprises measuring:

the voltage across the loudspeaker voice coil; and the current flowing through the loudspeaker voice coil.

10. The method of claim 1, wherein the method comprises the step of determining the relative polarity of the loudspeaker with respect to other loudspeakers in a loudspeaker system.

11. An apparatus comprising:

impedance determining module configured to determine a plurality of impedance values of a loudspeaker, each of the impedance values corresponding to a different input signal or input signal portions provided to the loudspeaker; and polarity determining module configured to determine the polarity of the loudspeaker based on the impedance values.

12. The apparatus of claim 11, wherein the impedance determining module comprises:

current sensing means to measure the current passing through the loudspeaker;

a voltage sensing means to measure the voltage across the loudspeaker; and a processor configured to determine the ratio of the voltage to the current.

13. A non-transitory computer-readable medium containing program instructions, wherein execution of the program instructions by one or more processors causes the one or more processors to perform steps comprising:

determining a plurality of impedance values of a loudspeaker, each of the impedance values corresponding to a different input signal or input signal portions provided to the loudspeaker; and determining the polarity of the loudspeaker based on the impedance values.

* * * * *